(12) United States Patent
Ragonese et al.

(10) Patent No.: US 10,193,581 B2
(45) Date of Patent: Jan. 29, 2019

(54) GALVANIC ISOLATION CIRCUIT, CORRESPONDING SYSTEM AND METHOD

(71) Applicant: STMicroelectronics S.r.l., Agrate Brianza (IT)

(72) Inventors: Egidio Ragonese, Aci Catena (IT); Nunzio Spina, Catania (IT); Alessandro Parisi, Mascalucia (IT); Pierpaolo Lombardo, Calascibetta (IT); Nunzio Greco, Bronte (IT); Giuseppe Palmisano, S. Giovanni La Punta (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 15/468,306

(22) Filed: Mar. 24, 2017

(65) Prior Publication Data

US 2018/0062678 A1 Mar. 1, 2018

(30) Foreign Application Priority Data

Aug. 30, 2016 (IT) .................. 102016000088207

(51) Int. Cl.
*H04B 1/10* (2006.01)
*H01F 19/04* (2006.01)
(Continued)

(52) U.S. Cl.
CPC .............. *H04B 1/10* (2013.01); *H01F 19/04* (2013.01); *H03F 3/45183* (2013.01);
(Continued)

(58) Field of Classification Search
CPC .................................. H04B 1/38; H04B 1/40
(Continued)

(56) References Cited

U.S. PATENT DOCUMENTS 3,924,068 A 12/1975 Fletcher et al.
5,396,538 A 3/1995 Hong
(Continued)

FOREIGN PATENT DOCUMENTS

WO WO-2005122423 A2 12/2005
WO 2016130295 A1 8/2016

OTHER PUBLICATIONS

IT Search Report and Written Opinion for IT Appl. No. 201600088207 dated Jun. 2, 2017 (10 pages).
(Continued)

*Primary Examiner* — Dean Takaoka
(74) *Attorney, Agent, or Firm* — Crowe & Dunlevy (57) ABSTRACT

A galvanic isolation circuit is formed by a differential transformer having primary and secondary windings for transmission of signals over a carrier between the primary and the secondary windings of the transformer. A galvanic isolation oxide layer is provide between the primary and secondary windings. Each winding includes include a center tap providing a low-impedance paths for dc and low frequency components of common-mode currents through the differential transformer. A pass-band stage is coupled to the secondary winding of the transformer and configured to permit propagation of signals over said carrier through the pass-band amplifier stage while providing for a rejection of common-mode noise.

16 Claims, 4 Drawing Sheets

(51) Int. Cl.
*H03F 3/45* (2006.01)
*H04L 25/02* (2006.01)
*H01F 19/08* (2006.01)

(52) U.S. Cl.
CPC ......... *H03F 3/45632* (2013.01); *H04L 25/02* (2013.01); *H01F 2019/085* (2013.01); *H03F 2203/45084* (2013.01); *H03F 2203/45621* (2013.01); *H03F 2203/45642* (2013.01); *H03F 2203/45704* (2013.01)

(58) Field of Classification Search
USPC ........................................ 333/24 R; 375/219
See application file for complete search history.

(56) References Cited

U.S. PATENT DOCUMENTS

| | | |
|---|---|---|
| 6,366,166 B1 | 4/2002 | Belot |
| 6,466,126 B2 | 10/2002 | Collins et al. |
| 7,489,526 B2 | 2/2009 | Chen et al. |
| 7,701,732 B2 | 4/2010 | Ranstad |
| 7,706,154 B2 | 4/2010 | Chen et al. |
| 7,737,871 B2 | 6/2010 | Leung et al. |
| 7,983,059 B2 | 7/2011 | Chen |
| 8,084,894 B2 | 12/2011 | Chen |
| 8,284,007 B1 | 10/2012 | Langner et al. |
| 8,364,195 B2 | 1/2013 | Spina et al. |
| 8,576,930 B2 | 11/2013 | Lombardo et al. |
| 8,610,312 B2 | 12/2013 | Kikuchi |
| 8,618,630 B2 | 12/2013 | Kaeriyama |
| 8,674,486 B2 | 3/2014 | Haigh et al. |
| 8,680,690 B1 | 3/2014 | Steeneken et al. |
| 8,861,229 B2 | 10/2014 | Alfano et al. |
| 8,912,906 B2 | 12/2014 | Taniguchi et al. |
| 9,866,283 B2 * | 1/2018 | Subramonian ........ H04B 5/0087 |
| 2003/0042571 A1 | 3/2003 | Chen et al. |
| 2003/0063478 A1 | 4/2003 | Beranger et al. |
| 2004/0189271 A1 | 9/2004 | Hansson et al. |
| 2004/0210349 A1 | 10/2004 | Lenz et al. |
| 2004/0217749 A1 | 11/2004 | Orr et al. |
| 2004/0232971 A1 | 11/2004 | Kawasaki et al. |
| 2007/0121832 A1 | 5/2007 | Ghoshal |
| 2008/0181316 A1 | 7/2008 | Crawley et al. |
| 2008/0192509 A1 | 8/2008 | Dhuyvetter et al. |
| 2008/0231211 A1 | 9/2008 | Baarman et al. |
| 2008/0267212 A1 | 10/2008 | Crawley et al. |
| 2009/0168462 A1 | 7/2009 | Schopfer et al. |
| 2009/0207538 A1 | 8/2009 | Crawley et al. |
| 2009/0327783 A1 | 12/2009 | Doss |
| 2010/0052630 A1 | 3/2010 | Chen |
| 2012/0099345 A1 | 4/2012 | Zhao et al. |
| 2012/0256290 A1 | 10/2012 | Renna et al. |
| 2013/0188399 A1 | 7/2013 | Tang et al. |
| 2013/0277797 A1 | 10/2013 | Menath et al. |
| 2014/0085951 A1 * | 3/2014 | Kaeriyama ............ H04B 3/50 363/126 |
| 2014/0253225 A1 | 9/2014 | Lee et al. |
| 2014/0268917 A1 | 9/2014 | Ma et al. |
| 2014/0292419 A1 | 10/2014 | Ragonese et al. |
| 2014/0313784 A1 | 10/2014 | Strzalkowski |
| 2014/0346887 A1 | 11/2014 | Bhamidipati et al. |
| 2015/0123749 A1 | 5/2015 | Li et al. |
| 2015/0180528 A1 | 6/2015 | Ragonese et al. |
| 2015/0326127 A1 | 11/2015 | Peng et al. |
| 2015/0364249 A1 | 12/2015 | Palumbo et al. |
| 2016/0080181 A1 | 3/2016 | Yun et al. |
| 2016/0241211 A1 * | 8/2016 | Hassan ................. H03F 1/223 |
| 2017/0358993 A1 | 12/2017 | Ragonese et al. |

OTHER PUBLICATIONS

"Surging Across the Barrier: Digital Isolators Set the Standard for Reinforced Insulation," Analog Devices, Inc., Tech. Article, 2012, MS-2341 (5 pages).

"Techniken Zur Galvanischen Trennung von Schaltungen Und Deren Praktische Umsetzung," Technology Day, Nürnberg 18. Jun. 2009, Texas Instruments Inc. (54 pages).

Cantrell: "Reinforced Isolation in Data Couplers," Analog Devices, Inc., Tech. Article, 2011, MS-2242 (4 pages).

Chen: "Microtransformer Isolation Benefits Digital Control," Power Electronics Technology, pp. 20 25, Oct. 2008.

Kamath et al: "High-Voltage Reinforced Isolation: Definitions and Test Methodologies," Texas Instruments, Tech. Article, Nov. 2014, SLYY063 (10 pages).

Wayne, Scott: "iCoupler(R) Digital Isolators Protect RS-232,RS-485, and CAN Buses in Industrial, Instrumentation, and Computer Applications," www.analog.com, Analog Dialogue 3910, Oct. 2005, (4 pages).

EPO Search Report and Written Opinion for co-pending Application No. EP17161341 dated Jun. 2, 2017 (12 pages).

Chen: "Fully integrated isolated dc-dc converter using micro transformers", in Proc. IEEE Applied Power Electronics Conference and Exposition, (APEC), pp. 335 338, Feb. 2008.

Chen: "iCoupler® products with isoPower™ technology: signal and power transfer across isolation barrier using microtransformers", Technical Article, Analog Devices (4 pages).

Chen: "Isolated half-bridge gate driver with integrated high-side supply", Proc. IEEE Power Electronics Specialists Conf. (PESC) pp. 3615-3618, Jun. 2008.

Fiore, et al: "A fully-integrated watt-level power transfer system with on-chip galvanic isolation in silicon technology", IEEE Trans. On Power Electronics, 2016 (12 pages).

Greco, et al: "A galvanically isolated dc dc converter based on current-reuse hybrid-coupled oscillators", IEEE Trans. Circuits Syst. II, Mar. 2016 (5 pages).

Lombardo, et al: "A fully-integrated half-duplex data/power transfer system with up to 40Mbps data rate, 23mW output power and on-chip 5kV galvanic isolation", IEEE International Solid-State Circuits Conference (ISSCC), San Francisco, USA, Feb. 2016, pp. 300-301.

Marwat: "Digital isolators compliance to IEC 61010-1 edition 3.0 safety requirements", Texas Instruments, White paper, 2014, SLYY055 (5 pages).

Sankaran, et al: "An Efficient and Resilient Ultra-High Speed Galvanic Data Isolator Leveraging Broad-Band Multi Resonant Tank Electro-Magnetic Coupling" in 2015 Symposium on VLSI Circuits Digest of Technical Papers, pp. 210-211.

Spina, et al: "Current-reuse transformer coupled oscillators with output power combining for galvanically isolated power transfer systems", IEEE Transaction on Circuits and Systems I, vol. 62, pp. 2940 2948, Dec. 2015.

First Office Action from co-pending EP Appl. No. 17161341.7 dated Jul. 9, 2018 (7 pages).

* cited by examiner

GALVANIC ISOLATION CIRCUIT, CORRESPONDING SYSTEM AND METHOD

PRIORITY CLAIM

This application claims the priority benefit of Italian Application for Patent No. 102016000088207, filed on Aug. 30, 2016, the disclosure of which is hereby incorporated by reference in its entirety.

TECHNICAL FIELD

The description relates to galvanic isolation circuits. One or more embodiments may apply to circuits for rejecting common-mode transients (CMTs) in galvanically isolated power/data transfer systems (i.e., dc-dc converter with isolated data channels).

BACKGROUND

Various applications may involve transferring power and data through a galvanic isolation barrier of, for example, several kilovolts. Systems used in the industrial field (e.g., high-side gate drivers), the medical field (e.g., implantable devices), in isolated sensor interfaces and lighting may be exemplary of such applications.

These isolated systems may be designed to provide galvanic isolation in the range of 2-10 kV. Dynamic isolation in the order of several tens of kV/µs may also be a desired feature, for example in order to handle rapid shifts in the ground references. Parasitic capacitive couplings between isolated units, such as interfaces, may lead these ground shifts to result in the injection of a common-mode current, $I_{CM}$. The injected current may in turn produce dangerous overvoltages and/or data transmission errors so that undesired degradation of Bit Error Rate (BER) may ensue.

Such a current $I_{CM}$ may include a dc component proportional both to the parasitic capacitance of the isolation barrier, $C_P$, and to the (maximum) voltage slew rate, $dV_{CM}/dt$, between two isolated units, i.e., $I_{CM}=C_P \, dV_{CM}/dt$. The current $I_{CM}$ may also convey high-frequency harmonics.

Common-mode transient immunity (CMTI) defines the maximum voltage slew rate (dV/dt) between two isolated interfaces that an isolated system is able to withstand.

There is a need in the art to address the drawbacks outlined in the foregoing, by facilitating achieving constant common mode transient immunity (CMTI) performance, for example, at increasing data rates.

SUMMARY

One or more embodiments may relate to a system and/or a method.

In one or more embodiments, galvanic isolation may be facilitated by thick oxide between the coils of a differential integrated transformer with primary and secondary center taps.

In one or more embodiments, the center taps of the transformer may be used as low impedance paths for parasitic currents (dc component and low frequency components).

In one or more embodiments, an integrated pass-band amplifier stage may be included in order to reject high frequency common-mode noise, while improving low frequency noise rejection.

In comparison with certain known arrangements, one or more embodiments may facilitate achieving constant common-mode transient immunity (CMTI) performance at increasing data rates, with (only) common-mode filtering implemented.

One or more embodiments may offer one or more of the following advantages:
  controlled current consumption may facilitate achieving high power efficiency; this may be beneficial in isolated dc-dc converters arrangements wherein data communication occurs;
  compatibility with (fully) integrated approaches;
  intrinsic limitation of CMT rejection is avoided (e.g., via cascaded pass-band amplifier stages);
  no trade-offs between CMT rejection and the injected current level involved;
  CMT rejection performance may be independent of data rate;
  an active filtering stage may be used in order to increase the overall receiver gain.

BRIEF DESCRIPTION OF THE DRAWINGS

One or more embodiments will now be described, by way of example only, with reference to the annexed figures, wherein.

DETAILED DESCRIPTION

In the ensuing description, one or more specific details are illustrated, aimed at providing an in-depth understanding of examples of embodiments of the instant description. The embodiments may be obtained by one or more of the specific details or with other methods, components, materials, and so on. In other cases, known structures, materials or operations are not illustrated or described in detail so that certain aspects of embodiment will not be obscured.

Reference to "an embodiment" or "one embodiment" in the framework of the present description is intended to indicate a particular configuration, structure, characteristic described in relation to the embodiment is compliance in at least one embodiment. Hence, phrases such as "in an embodiment" or "in one (or more) embodiments" that may be present in one or more points in the present description do not necessarily refer to one and the same embodiment. Moreover, particular conformation, structures or characteristics as exemplified in connection with any of the figures may be combined in any other quite way in one or more embodiments as possibly exemplified in other figures.

The references used herein are provided merely for convenience and hence do not define the extent of protection or the scope of the embodiments.

Figure 1:
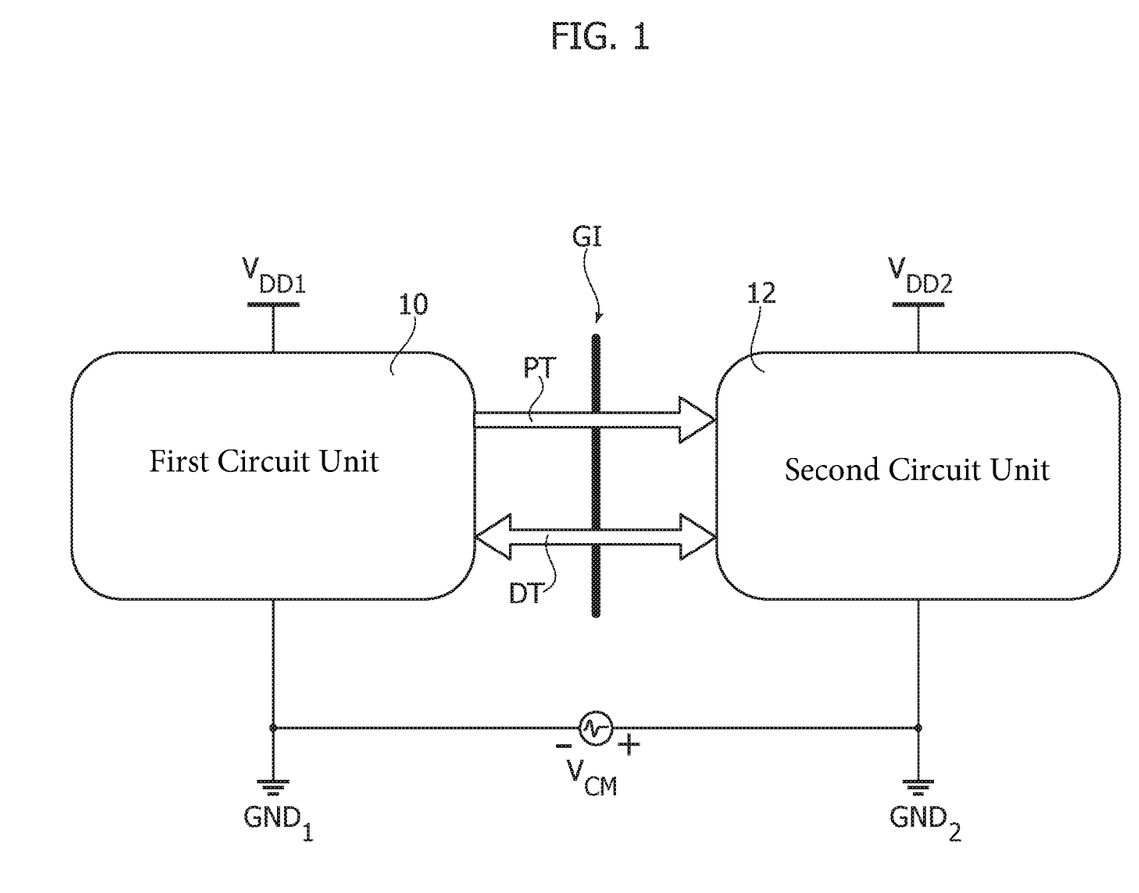
FIG. 1 is an exemplary representation of a possible context of use of embodiments.

One or more embodiments may provide a (galvanic) isolation barrier GI in a system having the general layout exemplified in FIG. 1, namely a system including a first circuit unit 10 and a second circuit unit 12 having respective supply lines $V_{DD1}$, $V_{DD2}$ and grounds $GND_1$ and $GND_2$. A common mode signal $V_{CM}$ may be established between the two grounds $GND_1$ and $GND_2$ which may be exposed to ground shifts and thus to transients or CMTs (e.g. $dV_{CM}/dt$).

One or more embodiments may apply to systems where power transfer PT is provided from the first circuit unit 10 to the second circuit unit 12 while (optionally bi-directional, e.g. half-duplex) data transfer DT may occur between the first circuit unit 10 and the second circuit unit 12.

Human/data interfaces, bus/network controllers, including, for example, microcontroller units (μCUs) may be exemplary of first circuit unit 10.

Sensor interfaces, gate drivers, medical equipment, communication network devices may be exemplary of the second circuit units 12.

One or more embodiments may provide a (galvanic) isolation circuit adapted for use e.g. in fully integrated implementations, such as is disclosed, for example, in U.S. patent application Ser. No. 15/178,822, filed Jun. 10, 2016 (incorporated by reference).

One or more embodiments may provide a common-mode transient (CMT) rejection circuit including a low-impedance path for dc and low frequency components of the common-mode currents, while implementing an active filtering for high-frequency components.

Standards such as, for example, VDE 0884-10 (incorporated by reference) have been developed in order to expressly take into account the availability of highly integrated semiconductor isolators with micro-scale isolation barriers, using either magnetic or capacitive transfer techniques.

Either post-processed or integrated isolation capacitors can be used in providing galvanically isolated data communication as taught by Marwat, "Digital isolators compliance to IEC 61010-1 edition 3.0 safety requirements", Texas Instruments, White paper, 2014, SLYY055 (incorporated by reference). Capacitive isolators may use a two-chip solution (i.e., RX and TX), exploiting either RF amplitude modulation or pulsed transmission. However, capacitive isolator techniques may not be able to provide power transfer due to the detrimental voltage partition at the input of power rectifier.

Transformer-based isolators can also used for data transmission. Isolation transformers may be implemented by means of post-processing steps as taught by Chen, "iCoupler® products with isoPower™ technology: signal and power transfer across isolation barrier using microtransformers", Technical Article, Analog Devices (incorporated by reference). Post-processed isolation transformers may also be exploited for high-efficiency power transfer by using a dedicated link made up of a power oscillator (i.e., the dc-ac converter) and a rectifier (i.e., the ac-dc converter) as taught by: United States Patent Application Publication No. 2010/0052630 (incorporated by reference); Chen, "Fully integrated isolated dc-dc converter using micro transformers", in Proc. IEEE Applied Power Electronics Conference and Exposition, (APEC), pp. 335-338, February 2008 (incorporated by reference); and Chen, "Isolated half-bridge gate driver with integrated high-side supply", Proc. IEEE Power Electronics Specialists Conf. (PESC) pp. 3615-3618, June 2008 (incorporated by reference).

Certain integrated transformers capable of sustaining several kilovolts have been also developed as taught by United States Patent Application Publication No. 2015/0364249 (incorporated by reference). Based on this technology, galvanically isolated data transfer systems were made available at taught by Spina, et al., "Current-reuse transformer coupled oscillators with output power combining for galvanically isolated power transfer systems", IEEE Transaction on Circuits and Systems I, vol. 62, pp. 2940 2948, December 2015 (incorporated by reference), while high-efficiency power transfer has been recently demonstrated by: Spina, et al., "Current-reuse . . . " (noted above); Lombardo, et al., "A fully-integrated half-duplex data/power transfer system with up to 40 Mbps data rate, 23 mW output power and on-chip 5 kV galvanic isolation", IEEE International Solid-State Circuits Conference (ISSCC), San Francisco, USA, February 2016, pp. 300-301 (incorporated by reference); Greco, et al., "A galvanically isolated dc dc converter based on current-reuse hybrid-coupled oscillators", IEEE Trans. Circuits Syst. II, March 2016 (incorporated by reference); and Fiore, et al., "A fully-integrated watt-level power transfer system with on-chip galvanic isolation in silicon technology", IEEE Trans. on Power Electronics, 2016 (incorporated by reference).

The main advantages and drawbacks of various different isolation approaches in terms of common-mode transient immunity (CMTI) performance are summarized in the table below.

| Isolation approaches | Main features | CMTI performance |
| --- | --- | --- |
| Integrated capacitors | On-chip galvanic isolation Data transfer products already available Trade-off cost/area and isolation | High CMTI may involve complex additional circuitry to overcome injected currents due to isolation capacitors (i.e. differential paths) |
| Post-processed transformer | Data and power transfer products available High galvanic isolation rating achievable Low level of integration Degraded efficiency at high isolation rating | Low parasitic capacitances allow high CMTI to be achieved when dedicated data channel is used |
| Integrated transformers | On-chip galvanic isolation Data transfer products Power transfer demonstrated Limited isolation due to oxide thickness | High CMTI for data transfer may be achieved despite higher parasitic capacitances |

Capacitive-based isolators are inherently affected by common-mode transients, which may require additional circuitry for the CMT rejection.

Transformer-based isolation approaches may benefit from better CMTI thanks to lower (parasitic) capacitances between the transformer windings. However, on-chip isolation transformers (see, United States Patent Application Publication No. 2015/0364249) may exhibit significant parasitic capacitances due to a reduced thickness of the isolation layer with respect to post-processed devices, thus requiring proper CMT rejection circuits.

In brief, current approaches for CMT rejection in galvanically-isolated systems may include:

a low-impedance input stage in the RX (receiver) block;

common-mode feedback circuitry; and a multi-resonant filtering isolation network.

The first approach may exploit a type of a common-base/common-gate input stage to draw high common-mode currents thanks to a low-impedance path. A bias current higher than the common-mode injected current may be needed in order to preserve data communication. Also, despite its simplicity, this solution may have poor power efficiency and thus is not suited for arrangements involving power transfer (see, for example, the circuit shown in FIG. 1).

As indicated, certain solutions may adopt a common-mode feedback circuitry to draw the common-mode injected current. See, for example, U.S. Pat. Nos. 8,364,195 and 8,576,930 (incorporated by reference). Low static power consumption can thus be achieved to preserve the overall system efficiency, with CMTI performance possibly adversely affected by limited bandwidth. This approach is suited when low parasitic capacitances—and therefore low common-mode currents—are generated, or if the CMTI specification is not very stringent.

The last approach mentioned above may involve a multi-resonant passive filtering network with on-board isolation devices (see, United States Patent Publication No. 2014/0346887, incorporated by reference). As demonstrated by Sankaran et al., "An efficient and resilient ultra-high speed galvanic data isolator leveraging broad-band multi resonant tank electro-magnetic coupling", in Proc. IEEE Symp. on VLSI Circuits, pp. 210 211, June 2015 (incorporated by reference), a CMTI up to 150 kV/µs may be achieved with this approach. However, such an approach may not be suitable for use in a (fully) integrated dc-dc converter architecture. Also, CMTI performance may be dependent on data rate due to the filter being unable to discriminate differential and common-mode signals.

Figure 2:
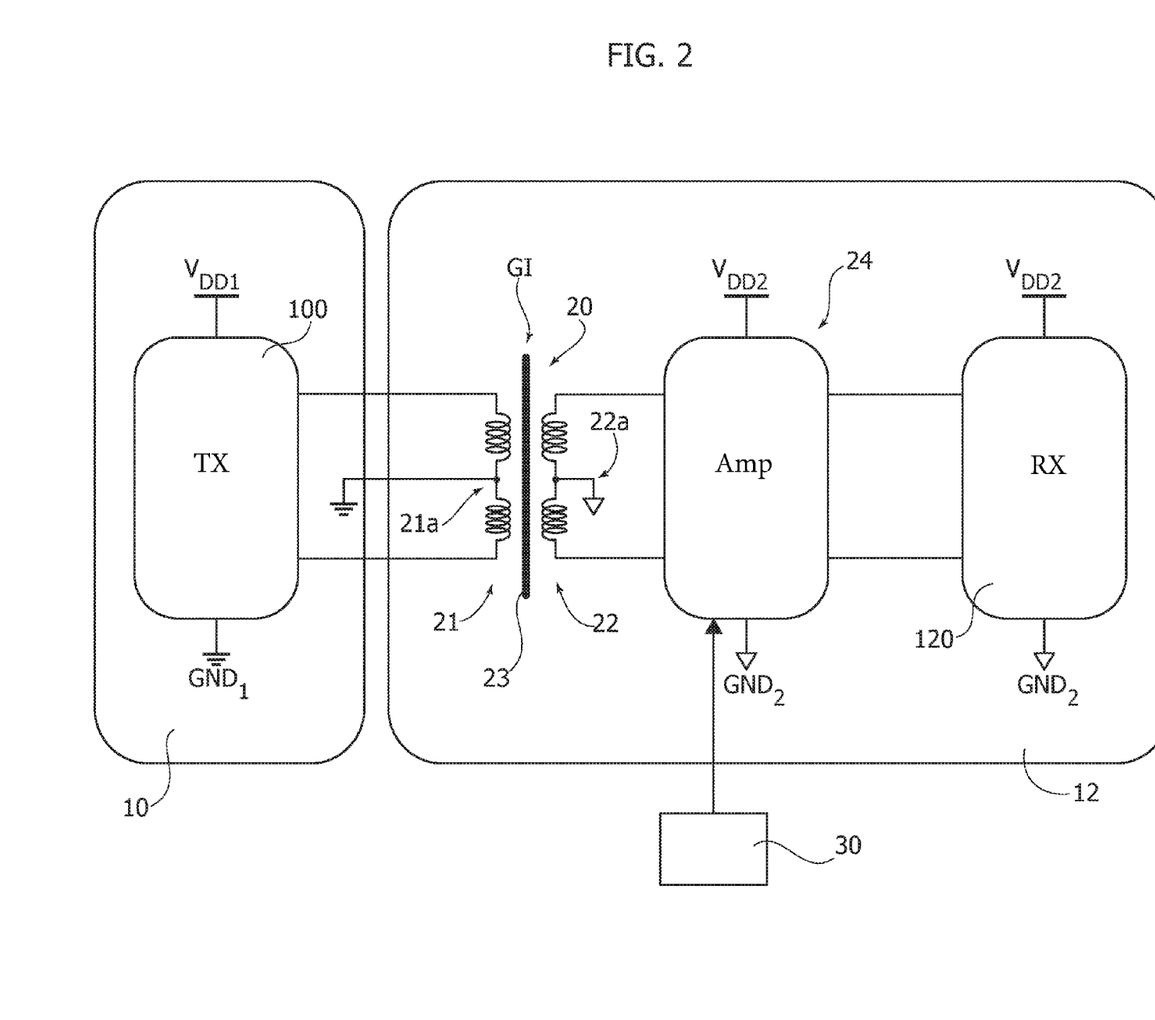
FIG. 2 is a block diagram of embodiments.
Figure 3:
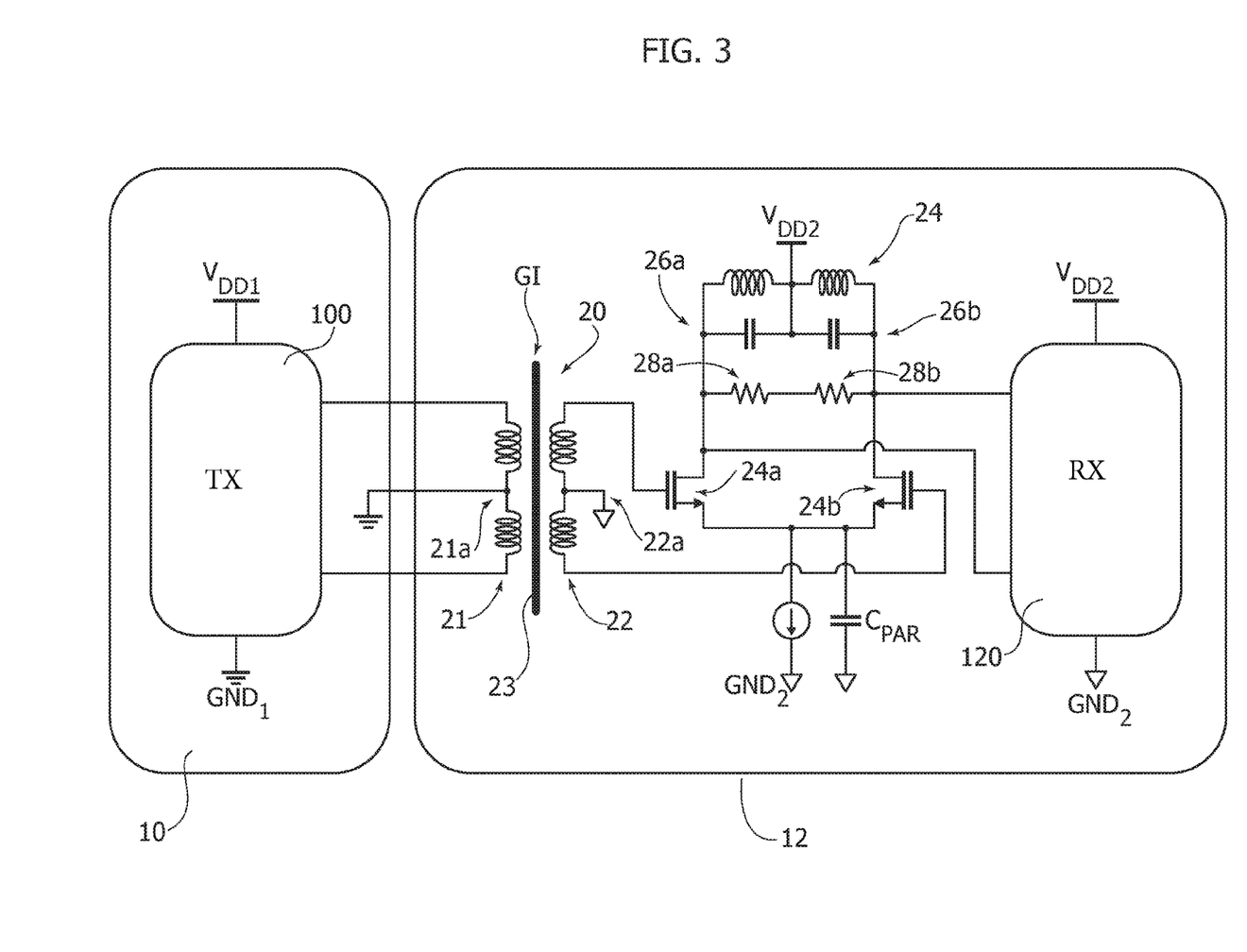
FIG. 3 is a further block diagram of embodiments.

One or more embodiments are exemplified in FIGS. 2 and 3, where parts or elements corresponding to parts or elements with FIG. 1 are indicated with like references.

FIGS. 1 and 3 show a system including a first circuit unit 10 and a second circuit unit 12 (e.g., two distinct semiconductor chips) having respective supply lines $V_{DD1}$, $V_{DD2}$ and grounds $GND_1$ and $GND_2$.

The grounds $GND_1$ and $GND_2$ which may be exposed to ground shifts and thus to transients or CMTs (e.g., $dV_{CM}/dt$).

In one or more embodiments, the first circuit unit 10 and the second circuit unit 12 may include a transmitter (TX) 100 and a receiver (RX) 120.

In one or more embodiments as exemplified in FIGS. 2 and 3, a galvanic isolation barrier GI may include a differential (e.g., integrated) transformer 20 with primary and secondary windings 21 and 22, respectively.

In one or more embodiments, the primary and secondary windings 21 and 22 of the transformer 20 may include center taps 21a, 22a.

In one or more embodiments, the secondary winding 22 of the transformer 20 may drive an (e.g., integrated) pass-band stage 24, such as e.g. a pass-band amplifier (Amp) stage 24.

In one or more embodiments, the transformer 20 may provide galvanic isolation by means of a thick-oxide layer 23 between its windings 21 and 22.

In one or more embodiments, the center taps 21a, 22a of the primary and secondary windings 21 and 22 of the transformer 20 may provide low-impedance paths for the dc and low frequency components of the common-mode current.

In one or more embodiments, the pass-band amplifier stage 24 may reject high frequency common-mode noise, while improving low frequency noise rejection.

FIG. 3 (where parts or elements like parts or elements already discussed in connection with FIGS. 1 and 2 are indicated with like references, without unnecessarily repeating a corresponding description) shows a transistor-level scheme of one or more embodiments which may be used for RF amplitude modulation transmission DT between the circuit units 10 and 12.

In one or more embodiments as exemplified in FIG. 3, CMT filtering may be implemented by a pass-band amplifier stage 24 including a differential amplifier stage (e.g., transistors 24a, 24b such as FETs) with an (optionally symmetrical) LC resonant load 26a, 26b.

In one or more embodiments, the LC filter in the resonant load 26a, 26b may be tuned at a data carrier frequency as used for the (e.g., RF amplitude modulation-ASK) transmission DT, thus rejecting common-mode noise while allowing data transmission.

In one or more embodiments, the LC filter in the stage 24 may provide a high Q-factor for common-mode signals to better reject common-mode noise, while resistors 28a, 28b may be provided in order to reduce the Q-factor for differential signals to be compliant with data bit rate.

It was noted that the common-mode rejection ratio (CMRR) of a simple differential pair (e.g. transistors 24a, 24b) may be reduced at high frequencies due to the parasitic capacitance $C_{PAR}$ (e.g., at the FET sources).

Differently from certain conventional solutions, in one or more embodiments as exemplified herein, the CMTI may be independent of data rate. Moreover, current consumption may be controlled, which may be advantageous in increasing power efficiency.

The robustness of rejection circuitry of one or more embodiments was demonstrated with reference to a 50 Mb/s data link in the presence of a CMT with a slope of 25 kV/µs. An ASK modulated signal received at the secondary winding 22 of the transformer 20 was found to be affected by a common mode disturbance militating against accurate demodulation. After the CMT rejection circuitry (e.g.; the circuit 24) this disturbance was found to be removed, thus facilitating correct demodulation of the transmitted data stream.

For the sake of simplicity and ease of understanding, the preceding description was provided with reference to embodiments wherein the first circuit unit 10 and the second circuit unit 12 include a transmitter 100 and a receiver 120, with data transmission DT assumed to take place (unidirectionally) from the transmitter 100 to the receiver 120.

One or more embodiments may be easily included in systems where a RF isolated link is used for bidirectional (e.g. half-duplex) data transfer (e.g. by means of ASK modulation).

A galvanically isolated dc-dc converter with bidirectional data transmission as disclosed in U.S. patent application Ser. No. 15/178,822, filed Jun. 10, 2016 is exemplary of such a system.

Figure 4:
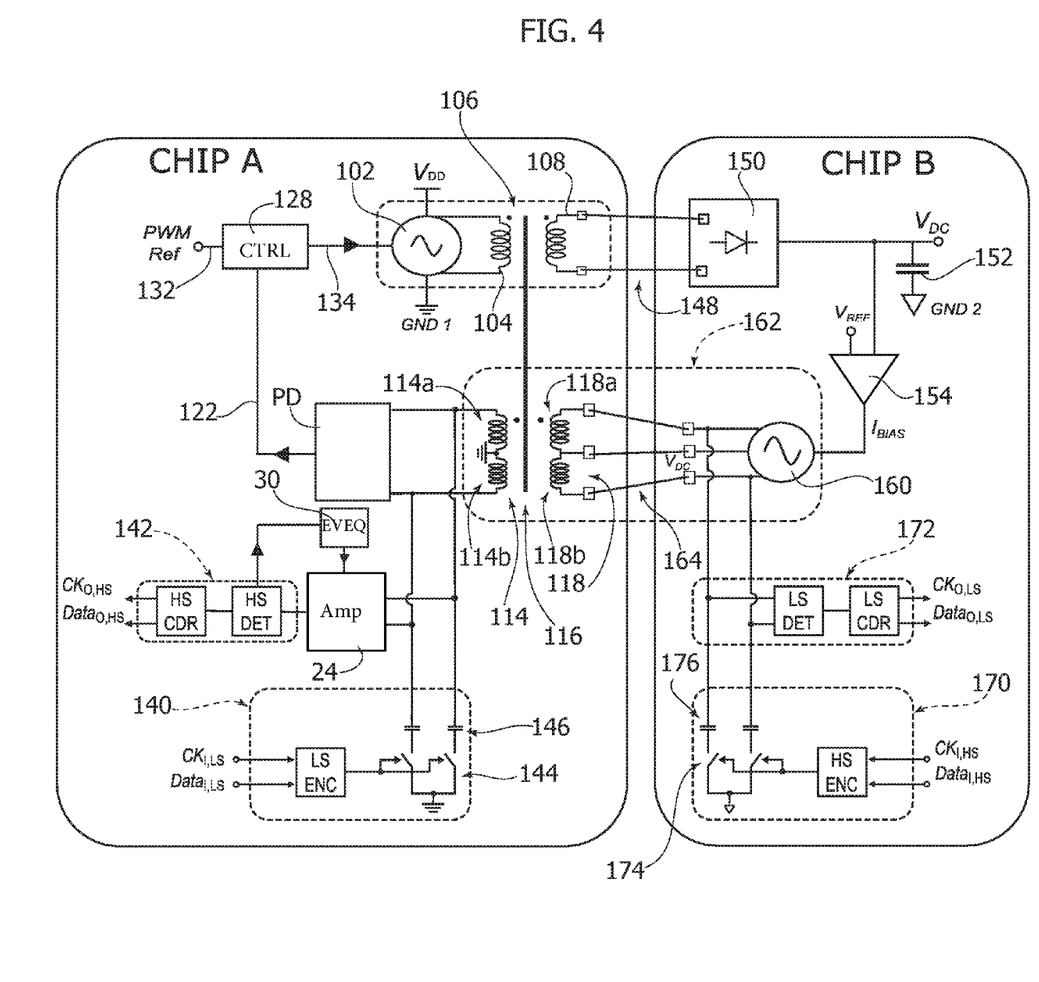
FIG. 4 is exemplary of possible applications of embodiments.

FIG. 4 herein is a block diagram based, for example, on FIGS. 5 and 6 of U.S. patent application Ser. No. 15/178,822 showing a general implementation of a galvanically isolated dc-dc converter with bidirectional data transmission using an isolated link to transfer power with high efficiency and a feedback link to control the output dc voltage and further support a bidirectional half duplex communication.

A first integrated circuit chip (Chip A; also referred to as a circuit or interface) includes an oscillator 102 powered from a first supply voltage VDD referenced to a first ground voltage GND1. The output terminals of the oscillator 102 are coupled to the terminals of a primary winding 104 of a first transformer 106. A power very high frequency (VHF) oscillator is formed by the oscillator 102 and first transformer 106. The first transformer 106 further includes a secondary winding 108 whose terminals are coupled to bonding pads of the first chip. The VHF frequency range for the oscillator signal output from the oscillator may, for example, be 100-500 MHz according to the design tradeoff for the building block efficiency (i.e., oscillator, transformer, rectifier).

The first chip A further includes a second transformer 116 having a center-tapped secondary winding 114 formed by windings 114a and 114b that are series coupled at a node connected to the first ground voltage or $V_{DD}$. The second transformer 116 further includes a center-tapped primary winding 118 formed by windings 118a and 118b that are series coupled at a node with the terminals of winding 118 and the center tap node coupled to bonding pads of the first chip.

The transformers 106 and 116 form the galvanic barrier and support first and second galvanically isolated links, respectively, between the first and second chips.

A peak detector circuit PD is coupled to the terminals of the secondary winding 114. The circuit PD functions to detect the peak voltage of an oscillating signal present at the secondary winding 114. An output signal 122 from the circuit PD indicative of that detected peak voltage is coupled to an input of a pulse width modulation (PWM) control circuit (CTRL) 128. The PWM control (CTRL) circuit 128 includes a further input 132 configured to receive a PWM reference signal in the form of an oscillating square wave signal with a frequency of a few tens of kilohertz to a few hundreds of kilohertz. The PWM CTRL circuit 128 responds to the difference between the output signal 122 and the PWM reference voltage to generate a PWM control signal 134 that is applied to control actuation (on/off) of the oscillator 102.

The first chip A further includes a low speed (LS) modulator circuit 140 configured to receive a data signal (Data$_{I,LS}$) and a clock signal (CK$_{I,LS}$). Outputs of the LS modulator circuit 140 are coupled to the terminals of the secondary winding 114 (i.e., coupled to the chip A side of the galvanic barrier for the second galvanically isolated link). A high speed (HS) demodulator circuit 142 includes inputs also coupled to the terminals of the secondary winding 114. The HS demodulator outputs a data signal (Data$_{O,HS}$) and a clock signal (CK$_{O,HS}$).

A second integrated circuit chip (Chip B; also referred to as a circuit or interface) includes a rectifier circuit 150 having inputs coupled to bonding pads of the second chip. These bonding pads are coupled by bonding wires 148 to the bonding pads on the first chip associated with the terminals of the secondary winding 108 of the first transformer 106. An output voltage V$_{DC}$ is generated by the rectifier circuit 150. That output voltage is stored/filtered by an output capacitor 152 coupled to a second ground voltage (GND2).

A differential amplifier circuit 154 includes a first input coupled to receive the output voltage V$_{DC}$ and a second input coupled to receive a reference voltage V$_{REF}$. The circuit 154 operates to determine a difference between the output voltage V$_{DC}$ and reference voltage V$_{REF}$, and generate a control signal (I$_{BIAS}$) in a feedback path. The control signal (I$_{BIAS}$) is an error signal indicative of the error between the output voltage V$_{DC}$ and reference voltage V$_{REF}$. This error is fed back to the first chip A for use in controlling PWM actuation of the oscillator 102 to achieve regulation of the output voltage V$_{DC}$ relative to the reference voltage V$_{REF}$ by controlling power transfer from chip A to chip B.

The second chip B further includes an oscillator 160 including first, second and third output terminals coupled to bonding pads of the second chip. These bonding pads are coupled by bonding wires 164 to the bonding pads on the first chip associated with the terminals and center tap node of the primary winding 118 of the second transformer 116.

A control data RF oscillator 162 is accordingly formed by the oscillator 160 and the second transformer 116. This control data radio frequency (RF) oscillator 162 is used to transmit the feedback error across the galvanic isolation to the first chip A with control signal (I$_{BIAS}$) causing a peak amplitude variation of the oscillation signal generated by the oscillator 160. The RF frequency range of the oscillator signal output by the oscillator 162 may, for example, be in the order of a few gigahertz.

The second chip B further includes a high speed (HS) modulator circuit 170 configured to receive a data signal (Data$_{I,HS}$) and a clock signal (CK$_{I,HS}$). Outputs of the HS modulator circuit 170 are coupled to the first and third terminals of the oscillator 160 and corresponding terminals of the primary winding 118 (i.e., coupled to the chip B side of the galvanic barrier for the second galvanically isolated link). A low speed (LS) demodulator circuit 172 includes inputs also coupled to the terminals of the primary winding 118. The LS demodulator outputs a data signal (Data$_{O,LS}$) and a clock signal (CK$_{O,LS}$).

FIG. 4 also exemplifies a possible implementation of the modulators and demodulators for implementation of half-duplex data transmission using amplitude shift keying (ASK) modulation techniques in a galvanically isolated dc-dc converter with bidirectional data transmission.

The low speed (LS) modulator circuit 140 includes an encoder (ENC) circuit configured to receive the data signal (Data$_{I,LS}$) and clock signal (CK$_{I,LS}$). The encoder circuit generates control signals for controlling actuation of switching circuits 144 (such as, for example, transistor switches) that are coupled between the terminals of the secondary winding 114 and the first ground voltage. Capacitors 146 are coupled between the terminals of the secondary winding 114 and switching circuits 144. The LS modulator circuit 140 is accordingly coupled to the chip A side of the galvanic barrier for the second galvanically isolated link.

The high speed (HS) demodulator circuit 142 includes a demodulation detector (DET) circuit coupled to the terminals of the secondary winding 114. The output of the DET circuit is processed by clock and data recovery (CDR) circuit that outputs a data signal (Data$_{O,HS}$) and a clock signal (CK$_{O,HS}$). The HS demodulator circuit 142 is accordingly coupled to the chip A side of the galvanic barrier for the second galvanically isolated link.

The high speed (HS) modulator circuit 170 includes an encoder (ENC) circuit configured to receive the data signal (Data$_{I,HS}$) and clock signal (CK$_{I,HS}$). The encoder circuit generates control signals for controlling actuation of switching circuits 174 (such as, for example, transistor switches) that are coupled between the first and third terminals of the oscillator 160 (the terminals of the primary winding 114) and the second ground voltage. Capacitors 176 are coupled between the first and third terminals of the oscillator 160 (the terminals of the primary winding 114) and switching circuits 174. The HS modulator circuit 170 is accordingly coupled to the chip B side of the galvanic barrier for the second galvanically isolated link.

The low speed (LS) demodulator circuit 172 includes a demodulation detector (DET) circuit coupled to the first and third terminals of the oscillator 160 (the terminals of the primary winding 114). The output of the DET circuit is processed by clock and data recovery (CDR) circuit that outputs a data signal (Data$_{O,LS}$) and a clock signal (CK$_{O,LS}$). The LS demodulator circuit 172 is accordingly coupled to the chip B side of the galvanic barrier for the second galvanically isolated link.

The galvanically isolated dc-dc converter with bidirectional data transmission as shown in FIG. 4 operates as follows. The output voltage V$_{DC}$ is delivered from the first chip A to second chip B by power transfer across the galvanic barrier using a power link i.e., the first galvanically isolated link) formed by the power VHF oscillator that uses the first (isolation) transformer 106 as a resonant load and the rectifier circuit 150. The output voltage $V_{DC}$ is controlled in regulation by a feedback signal delivered from second chip B to first chip A across the galvanic barrier using a feedback isolated link (i.e., the second galvanically isolated link) formed by the CTRL RF oscillator 160 that uses the second (isolation) transformer 116 as a resonant load and the peak detector circuit PD. The control information of the feedback signal is generated by the differential amplifier 154 and is contained in the modulated amplitude of the RF control signal generated by the oscillator 160. This amplitude is easily detected by the peak detector circuit to generate the output signal 122 which drives the PWM CTRL circuit 128. The PWM control signal 134 turns the power oscillator 102 on and off with a frequency of a few hundreds of kilohertz, thus implementing a typical PWM modulation to vary the level of power transferred across the galvanic barrier for the first galvanically isolated link at maximum efficiency.

The feedback isolated link is further exploited to support a half-duplex data communication between chips A and B. By use of a desired modulation (for example, ASK) of the control signal at each winding of the isolation transformer 116, low speed (LS) data communication from chip A to chip B and high speed (HS) data communication from chip B to chip A may be accomplished by means of impedance mismatch at the transformer windings on one or the other side of the galvanic barrier through capacitors (references 146 and 176) and switch resistances (references 144 and 174). It is important that the adopted modulation (for example, amplitude shift keying ASK) preserve the peak of the RF signal which contains the control information. Typically, the maximum data rate from chip A to chip B is lower than the maximum data rate from chip B to chip A, hence the notations for low speed (LS) and high speed (HS). Each data channel includes a coding block (the encoder ENC) which encodes the data signal, a detector (DET) which demodulates the data signal and a clock/data recovery circuit (CDR). It will be noted that traditional coding schemes such as PWM or Manchester can be used.

In an embodiment, both isolation transformers 106 and 116 for the power link and the CTR/DATA link, respectively, are built within the first chip A. This can be implemented by the use of a thick oxide technology module as taught in United States Patent Application Publication No. 2015/0364249. This means that the second chip B can be fabricated in a standard process (i.e., without any thick oxide module).

As far as the common mode transient (CMT) immunity is concerned, the differential center-tapped CTRL/DATA isolation transformer 116 provides low impedance paths for common mode currents for both transformer windings.

Further CMT suppression circuitries as exemplified in amplifier 24 in FIGS. 2 and 3 can be also included in the demodulator (DET) circuits.

In one or more embodiments, an additional envelope equalization (EV EQ) block 30 may be provided to implement an automatic gain control (AGC) of the LC-tuned differential amplifier 24, thus providing the ASK detector with the same envelope level, independently of the RF control signal level.

In the system disclosed in U.S. patent application Ser. No. 15/178,822, a VHF power oscillator may use an isolation transformer to increase power transfer efficiency, while an RF isolated link may be used for the control feedback loop and bidirectional (half-duplex) data transfer by means of ASK modulation which is performed by means of impedance mismatch at the RF windings.

In such an arrangement, a CMT rejection block as disclosed herein may improve the robustness to CMTs of the HS data communication.

It will be appreciated that while FIGS. 2 and 3 refer to the winding 21—left side—and the winding 22—right side—as the center-tapped primary and secondary windings of the transformer 20 (with the winding 22 coupled with the LC-tuned differential circuit e.g. amplifier 24), in the representation of FIG. 4 refers to the primary winding 118 and the secondary winding 114 as arranged on the right side and the left side, respectively, of the transformer 116.

In that respect, it will be appreciated that "hosting" the galvanic isolation circuit (e.g., the transformer 20) at one of the circuit units (e.g., circuit unit 12 as shown in FIGS. 2 and 3) is merely exemplary, insofar as in one or more embodiments that circuit may be at least partly hosted at the other circuit unit (e.g., circuit unit 10 as shown in FIGS. 2 and 3).

One or more embodiments may thus provide a circuit (e.g. GI), including:
  a differential transformer (e.g., 20, or 116 in FIG. 4) having primary (e.g., 21 or 118 in FIG. 4) and secondary (e.g., 22 or 114 in FIG. 4) windings for transmission of (e.g., data) signals (e.g., ASK) over a carrier (e.g., RF) between the primary and the secondary winding of the transformer, the primary and secondary windings having a galvanic isolation oxide layer (e.g., 23) therebetween, and including center taps (see, e.g., 21a, 22a or 118a, 118b and 114a, 114b in FIG. 4) providing low-impedance paths for dc and low frequency components of common-mode currents through the differential transformer, and
  a pass-band stage (e.g., 24) coupled to the secondary winding of the transformer, the pass-band stage configured (e.g., tuned to the carrier frequency used for signal transmission—DT) for permitting propagation of signals over said carrier through the pass-band stage while providing rejection of common-mode noise.

In one or more embodiments, said pass-band stage may include a pass-band amplifier stage, optionally a differential amplifier stage (e.g., 24a, 24b).

In one or more embodiments, said pass-band stage may include a LC resonant load (e.g., 26a, 26b).

In one or more embodiments, said LC resonant load may include at least one Q-factor adjusting resistance element (e.g., 28a, 28b).

In one or more embodiments, said pass-band stage may be coupled to the ends of (that is, across) the secondary winding of the transformer.

One or more embodiments may include:
  a transmitter (e.g., 100) configured for transmitting signals over a carrier (e.g., DT);
  a receiver (120) configured for receiving said signals over a carrier transmitted by said transmitter;
  a circuit (e.g., GI) according to one or more embodiments set between said transmitter and said receiver, said circuit providing a galvanically isolated (unidirectional and/or bi-directional, e.g., half-duplex) transmission path for said signals over a carrier between said transmitter and said receiver.

One or more embodiments may include said transmitter coupled with the primary winding of said transformer and said pass-band stage coupled with said receiver.

In one or more embodiments said transmitter and said receiver include respective distinct grounds (e.g., $GND_1$, $GND_2$), which may be exposed to ground shifts and thus to transients (CMTs).

One or more embodiments may include an automatic gain control block (e.g., 30) active on said pass-band stage (24) to provide automatic gain control of said signals over a carrier (DT).

In one or more embodiments a method of (uni-directionally or bi-directionally e.g., half-duplex) transmitting signals over a carrier (DT), may include:
- providing a circuit according to one or more embodiments;
- applying said signals over a carrier (DT) to one of the primary winding and the secondary winding of the transformer,
- detecting said signals over a carrier transmitted over said circuit at the other of the primary winding and the secondary winding of the transformer.

In one or more embodiments signals may thus be transmitted in one direction, for example, from the primary winding of the transformer to the pass-band stage coupled to the secondary winding of the transformer, while (e.g., half-duplex) transmission may possibly occur in the opposite direction from the secondary winding of the transformer to the primary winding of the transformer.

Without prejudice to the underlying principles, the details and the embodiments may vary, even significantly, with respect to what has been disclosed by way of example only in the foregoing, without departing from the extent of protection.

The extent of protection is defined by the annexed claims.

The invention claimed is:

1. A system, comprising:
   a differential transformer having a primary winding and a secondary winding configured to transmit signals over a carrier between the primary and secondary windings, wherein the primary and secondary windings have a galvanic isolation oxide layer therebetween, and wherein the primary and secondary windings each include a center tap providing low-impedance paths for dc and low frequency components of common-mode currents through the differential transformer; and
   a pass-band circuit coupled to the secondary winding of the transformer, said pass-band circuit configured to permit propagation of signals over said carrier through the pass-band circuit while providing for a rejection of common-mode noise.

2. The system of claim 1, further including a transmitter circuit coupled to the primary winding and a receiver coupled to the pass-band circuit.

3. The circuit of claim 1, wherein said pass-band circuit includes a pass-band amplifier stage.

4. The circuit of claim 2, wherein the pass-band amplifier stage is a differential amplifier stage.

5. The circuit of claim 1, wherein said pass-band circuit includes a LC resonant load.

6. The circuit of claim 5, wherein said LC resonant load includes at least one Q-factor adjusting resistance element.

7. The circuit of claim 1, wherein said pass-band circuit is coupled to terminals of the secondary winding of the transformer.

8. A system, comprising:
   a transmitter configured for transmitting signals over a carrier;
   a receiver configured for receiving said signals over a carrier transmitted by said transmitter; and
   a circuit positioned between said transmitter and said receiver, said circuit providing a galvanically isolated transmission path for said signals over the carrier between said transmitter and said receiver;
   wherein said transmitter is coupled with the primary winding of said transformer; and
   a pass-band circuit coupled with said receiver and configured to permit propagation of signals over said carrier through the pass-band circuit while providing for a rejection of common-mode noise.

9. The system of claim 8, wherein said pass-band circuit includes a LC resonant load.

10. The system of claim 9, wherein said LC resonant load includes at least one Q-factor adjusting resistance element.

11. The system of claim 8, wherein said pass-band circuit is coupled to terminals of the secondary winding of the transformer.

12. The system of claim 8, wherein said transmitter and said receiver include respective distinct grounds.

13. The system of claim 12, wherein the primary winding has a center tap coupled to the distinct ground of the transmitter and wherein the secondary winding has a center tap coupled to the distinct ground of the receiver.

14. The system of claim 8, further including an automatic gain control circuit active on said pass-band circuit to provide automatic gain control of said signals over the carrier.

15. A system, comprising:
   a transmitter referenced to a first ground voltage and having an output;
   a transformer having a primary winding and a secondary winding, wherein the primary winding is coupled to the output of the transmitter and has a center tap coupled to the first ground voltage;
   a receiver referenced to a second ground voltage isolated from the first ground voltage and having an input coupled to the secondary winding, wherein the secondary winding has a center tap coupled to the second ground voltage; and
   a differential amplifier circuit including a differential pair of input transistors coupled to terminals of the secondary winding and a differential pair of output terminals coupled to the input of the receiver;
   wherein the differential amplifier circuit further includes an LC resonant load and at least one Q-factor adjusting resistance element.

16. The system of claim 15, wherein the resistance element is coupled between the differential pair of output terminals.

* * * * *

UNITED STATES PATENT AND TRADEMARK OFFICE
CERTIFICATE OF CORRECTION

PATENT NO. : 10,193,581 B2
APPLICATION NO. : 15/468306
DATED : January 29, 2019
INVENTOR(S) : Egidio Ragonese et al.

Page 1 of 1

It is certified that error appears in the above-identified patent and that said Letters Patent is hereby corrected as shown below:

In the Claims
At Column 11, Claim number 1, Line number 41, please replace the phrase [[ the transformer ]] with -- the differential transformer --.
At Column 11, Claim number 4, Line number 50, please replace the phrase [[ Claim 2 ]] with -- Claim 3 --.
At Column 11, Claim number 5, Line number 53, please replace the phrase [[ includes a LC ]] with -- includes an LC --.
At Column 11, Claim number 7, Line numbers 57-58, please replace the phrase [[ the transformer ]] with -- the differential transformer --.
At Column 12, Claim number 8, Line number 6, please replace the phrase [[ a circuit positioned ]] with -- a transformer circuit positioned --.
At Column 12, Claim number 8, Line number 7, please replace the phrase [[ said circuit ]] with -- said transformer circuit --.
At Column 12, Claim number 8, Line numbers 10-11, please replace the phrase [[ the primary winding of said transformer ]] with -- a primary winding of said transformer circuit --.
At Column 12, Claim number 11, Line numbers 22-23, please replace the phrase [[ the secondary winding of the transformer ]] with -- a secondary winding of the transformer circuit --.

Signed and Sealed this
Thirtieth Day of July, 2019

Andrei Iancu
*Director of the United States Patent and Trademark Office*